(12) United States Patent
Oh

(10) Patent No.: US 8,456,216 B2
(45) Date of Patent: Jun. 4, 2013

(54) LEVEL SHIFTER

(75) Inventor: Eui Kyung Oh, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 54 days.

(21) Appl. No.: 13/160,598

(22) Filed: Jun. 15, 2011

(65) Prior Publication Data

US 2012/0133415 A1    May 31, 2012

(30) Foreign Application Priority Data

Nov. 26, 2010    (KR) .................. 10-2010-0119084

(51) Int. Cl.
*H03L 5/00*    (2006.01)
(52) U.S. Cl.
USPC .......................................... 327/333; 327/112
(58) Field of Classification Search
USPC ................ 327/333, 108, 112; 326/68, 80, 82; 365/189.11
See application file for complete search history.

(56) References Cited

U.S. PATENT DOCUMENTS 6,087,880 A * 7/2000 Takagi ........................... 327/333

FOREIGN PATENT DOCUMENTS

| JP | 09205351 A | 8/1997 |
|---|---|---|
| KR | 10-1998-0070751 A | 10/1998 |
| KR | 1020050011542 A | 1/2005 |

* cited by examiner

*Primary Examiner* — Hai L Nguyen
(74) *Attorney, Agent, or Firm* — William Park & Associates Patent Ltd.

(57) ABSTRACT

A level shifter includes a driving signal generating unit, a driving unit, and a current path forming unit. The driving signal generating unit is configured to generate a pull-up signal and a pull-down signal in response to an input signal, which may swing between a first high level and a first low level. The driving unit is configured to generate an output signal swinging between a second high level and a second low level in response to the pull-up signal and the pull-down signal. The current path forming unit is configured to form a current path between the pull-up signal and the pull-down signal in response to the pull-up signal and the pull-down signal.

16 Claims, 2 Drawing Sheets

LEVEL SHIFTER

CROSS-REFERENCES TO RELATED APPLICATIONS

The present application claims priority under 35 U.S.C 119(a) to Korean Application No. 10-2010-0119084, filed on Nov. 26, 2010 in the Korean intellectual property Office, and which is incorporated herein by reference in its entirety.

BACKGROUND

In general, a level shifter serves as an interface between circuits using different power supply voltages. For example, a signal for driving a word line driver swings between an external voltage VDD and a ground voltage VSS, whereas a signal used in a word line driver swings between a high voltage VPP and a ground voltage VSS. Thus, if two circuits are connected without level shifting, a leakage current may flow in a circuit using a high voltage VPP as a power supply voltage. Therefore, a level shifter is used to connect two circuits.

With increased integration density of semiconductor memory devices, a signal swinging between an external voltage VDD and a back-bias voltage VBB is required to reduce leakage current. Thus, a signal swinging between an external voltage VDD and a back-bias voltage VBB is generated by using a level shifter to level-shift a signal swinging between an external voltage VDD and a ground voltage VSS.

However, in a semiconductor memory device, a signal swinging between a peri voltage VPERI and a ground voltage VSS may need to be level-shifted to a signal swinging between a power supply voltage VDD and a back-bias voltage VBB. In this case, the semiconductor memory device may have two level shifters: a level shifter for level-shifting the signal swinging between the peri voltage VPERI and the ground voltage VSS to generate a signal swinging between the power supply voltage VDD and the ground voltage VSS, and a level shifter for level-shifting the signal swinging between the power supply voltage VDD and the ground voltage VSS to generate the signal swinging between the power supply voltage VDD and the back-bias voltage VBB.

SUMMARY

An embodiment of the present invention relates to a level shifter capable of reducing layout area by performing a level shifting operation in both directions.

In one embodiment, a level shifter includes a driving signal generating unit configured to generate a pull-up signal and a pull-down signal in response to an input signal, where the input signal swings between a first high level and a first low level. A driving unit may be configured to generate an output signal swinging between a second high level and a second low level in response to the pull-up signal and the pull-down signal and a current path forming unit configured to form a current path between the pull-up signal and the pull-down signal in response to the pull-up signal and the pull-down signal.

An embodiment of the invention may comprise a level shifting transistor circuit comprising a driving signal generating unit, a driving unit, and a current path forming unit. The driving signal generating unit may comprise a first PMOS transistor, a first NMOS transistor, a second PMOS transistor, and a second NMOS transistor. The driving unit comprising a third PMOS transistor and a third NMOS transistor, and the current path forming unit comprising a fourth NMOS transistor and a fourth PMOS transistor.

A substrate and a source terminal of the first PMOS transistor are coupled to a second high voltage rail, and a drain terminal of the first PMOS transistor is coupled to a drain terminal of the first NMOS transistor, to a gate terminal of the third PMOS transistor, to a drain terminal of the fourth NMOS transistor, and to a gate terminal and a source terminal of the fourth PMOS transistor. A substrate and a source terminal of the first NMOS transistor are coupled to a first low voltage rail, and a gate terminal of each of the first NMOS transistor and the second PMOS transistor is coupled to an input node.

A substrate and a source terminal of the second PMOS transistor are coupled to a first high voltage rail and a drain terminal of the second PMOS transistor is coupled to a drain terminal of the second NMOS transistor, a gate terminal and a source terminal of the fourth NMOS transistor, a drain terminal of the fourth PMOS transistor, and a gate terminal of the third NMOS transistor.

A substrate and a source terminal of the second NMOS transistor are coupled to the second low voltage rail, a substrate and a source terminal of the third PMOS transistor are coupled to the second high voltage rail, and a drain terminal of the third PMOS transistor is coupled to a gate terminal of the first PMOS transistor, a gate terminal of the second NMOS transistor, a drain terminal of the third NMOS transistor, and an output node.

A substrate and a source terminal of the third NMOS transistor are coupled to the second low voltage rail, a substrate of the fourth NMOS transistor is coupled to the first low voltage rail, and a substrate of the fourth PMOS transistor is coupled to the first high voltage rail.

An embodiment of the invention may comprise a level shifting transistor circuit wherein a substrate and a source terminal of a first PMOS transistor are coupled to a second high voltage rail, and a drain terminal of the first PMOS transistor is coupled to a drain terminal of a first NMOS transistor, a gate terminal of a third PMOS transistor, a drain terminal of a fourth NMOS transistor, and a gate terminal and a source terminal of a fourth PMOS transistor.

A substrate and a source terminal of the first NMOS transistor are coupled to a first low voltage rail, and a gate terminal of each of the first NMOS transistor and a second PMOS transistor is coupled to an input node. A substrate and a source terminal of the second PMOS transistor are coupled to a first high voltage rail, and a drain terminal of the second PMOS transistor is coupled to a drain terminal of a second NMOS transistor, a gate terminal and a source terminal of the fourth NMOS transistor, a drain terminal of the fourth PMOS transistor, and a gate terminal of a third NMOS transistor.

A substrate and a source terminal of the second NMOS transistor are coupled to the second low voltage rail. A substrate and a source terminal of the third PMOS transistor are coupled to the second high voltage rail and a drain terminal of the third PMOS transistor is coupled to a gate terminal of the first PMOS transistor, a gate terminal of the second NMOS transistor, a drain terminal of the third NMOS transistor, and an output node.

A substrate and a source terminal of the third NMOS transistor are coupled to the second low voltage rail, a substrate of the fourth NMOS transistor is coupled to the first low voltage rail, and a substrate of the fourth PMOS transistor is coupled to the first high voltage rail.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
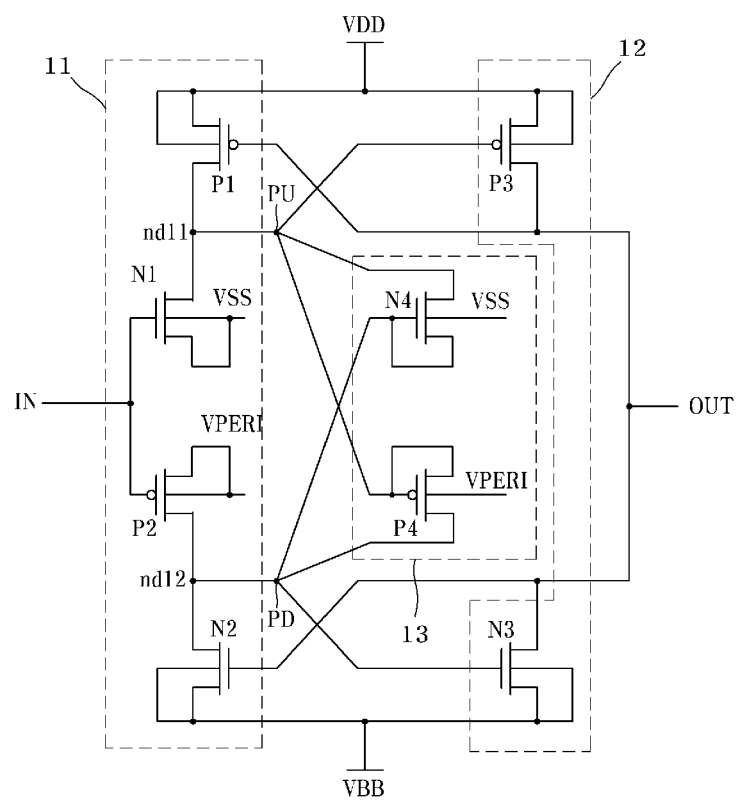
FIG. 1 is a circuit diagram of a level shifter according to an exemplary embodiment of the present invention.

FIG. 1 is a circuit diagram of a level shifter according to an exemplary embodiment of the present invention.

Referring to FIG. 1, a level shifter according to an exemplary embodiment of the present invention includes a driving signal generating unit 11, a driving unit 12, and a current path forming unit 13. The driving signal generating unit 11 is configured to generate a pull-up signal PU and a pull-down signal PD in response to an input signal IN swinging between a first high level VPERI and a first low level VSS. The driving unit 12 is configured to generate an output signal OUT swinging between a second high level VDD and a second low level VBB in response to the pull-up signal PU and the pull-down signal PD. The current path forming unit 13 is configured to form a current path between the pull-up signal PU and the pull-down signal PD in response to the pull-up signal PU and the pull-down signal PD.

The first high level VPERI is a peri voltage that is supplied to a peri region including control circuits for controlling memory cells in a semiconductor memory device. The second high level VDD is an external voltage that is supplied from an external device. The first low level VSS is a ground voltage that is supplied from an external device. The second low level VBB is a back-bias voltage that is supplied to increase the threshold voltage of a MOS transistor. In this embodiment, the first high level VPERI is set to approximately 1.4 V, the second high level VDD is set to approximately 1.8 V, the first low level VSS is set to approximately 0V, and the second low level VBB is set to approximately −200 mV. According to exemplary embodiments, the first high level VPERI, the second high level VDD, the first low level VSS, and the second low level VBB may be set to various levels. Herein, the second high level VDD is higher than the first high level VPERI, and the second low level VBB is lower than the first low level VSS.

The driving signal generating unit 11 includes a first PMOS transistor P1, a first NMOS transistor N1, a second PMOS transistor P2, and a second NMOS transistor N2. The first PMOS transistor P1 is connected between the second high level VDD and a node nd11 outputting the pull-up signal. In response to a low voltage of the output signal OUT, the first PMOS transistor P1 is turned on to drive the pull-up signal PU to the second high level VDD. The first NMOS transistor N1 is connected between the node nd11 and the first low level VSS. In response to a high voltage of the input signal IN, the first NMOS transistor N1 is turned on to drive the node nd11 to the first low level VSS. The second PMOS transistor P2 is connected between the first high level VPERI and a node nd12. In response to a low voltage of the input signal IN, the second PMOS transistor P2 is turned on to drive the node nd12 to the first high level VPERI. The second NMOS transistor N2 is connected between the node nd12 and the second low level VBB. In response to a high voltage of the output signal OUT, the second NMOS transistor N2 is turned on to drive the pull-down signal PD to the second low level VBB.

Accordingly, when the input signal IN is at the first high level VPERI, the driving signal generating unit 11 turns on the first NMOS transistor N1 to drive the pull-up signal PU to the first low level VSS. When the input signal IN is at the first low level VSS, the driving signal generating unit 11 drives the pull-down signal PD to the first high level VPERI. Also, when the output signal OUT is at the second high level VDD, the driving signal generating unit 11 drives the pull-down signal PD to the second low level VBB. When the output signal OUT is at the second low level VBB, the driving signal generating unit 11 drives the pull-up signal PU to the second high level VDD.

The driving unit 12 includes a third PMOS transistor P3 and a third NMOS transistor N3. The third PMOS transistor P3 is connected between the second high level VDD and the output signal OUT. In response to a low voltage of the pull-up signal PU, the third PMOS transistor P3 is turned on to pull-up drive the output signal OUT to the second high level VDD. The third NMOS transistor N3 is connected between the output signal OUT and the second low level VBB. In response to a high voltage of the pull-down signal PD, the third NMOS transistor N3 is turned on to pull-down drive the output signal OUT to the second low level VBB.

The current path forming unit 13 includes a fourth NMOS transistor N4 and a fourth PMOS transistor P4. The fourth NMOS transistor N4 operates as a diode that is turned on to transfer the level of the pull-down signal PD to the pull-up signal PU when the pull-down signal PD is driven to the first high level VPERI. The fourth PMOS transistor P4 operates as a diode that is turned on to transfer the level of the pull-up signal PU to the pull-down signal PD when the pull-up signal PU is driven to the first low level VSS.

Figure 2:
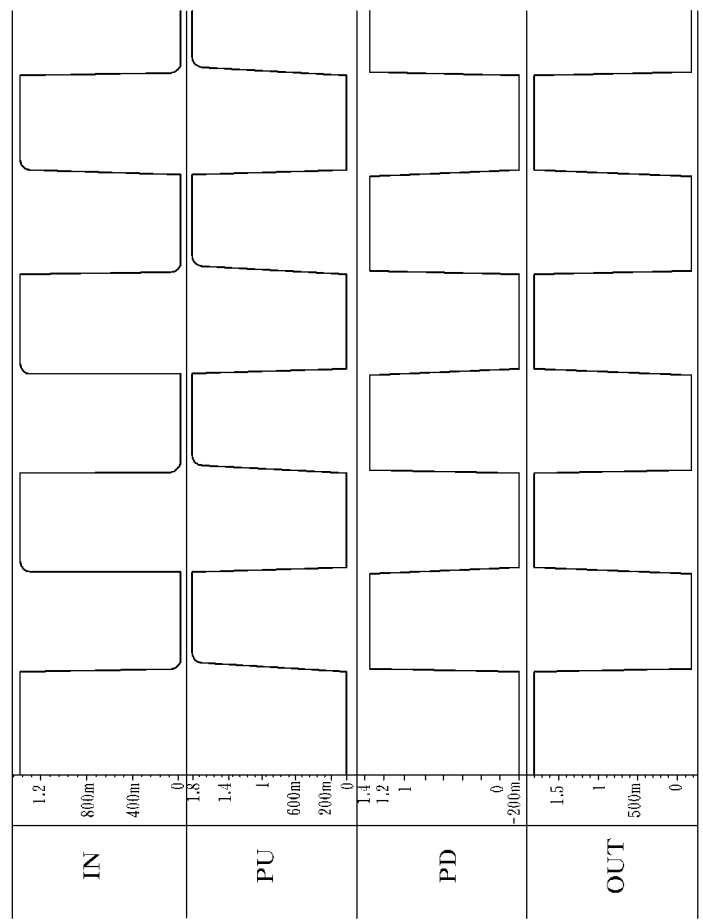
FIG. 2 is a timing diagram illustrating the operation of the level shifter illustrated in FIG. 1.

FIG. 2 is a timing diagram illustrating the operation of the level shifter illustrated in FIG. 1.

Hereinafter, the operation of the level shifter will be described in detail with reference to FIG. 2. The operation of the level shifter may be divided into an operation of the case where the input signal IN is at the first high level VPERI and an operation of the case where the input signal IN is at the first low level VSS.

The operation of the case where the input signal IN is at the first high level VPERI is as follows.

Referring to FIG. 2, when the input signal IN is inputted at the first high level VPERI (e.g., 1.4 V), the first NMOS transistor N1 of the driving signal generating unit 11 is turned on to drive the pull-up signal PU to the first low level VSS (e.g., 0 V).

The third PMOS transistor P3 of the driving unit 12 is turned on by the pull-up signal PU of the first low level VSS to pull-up drive the output signal OUT to the second high level VDD (e.g., 1.8 V). When the output signal OUT is driven to the second high level VDD, the second NMOS transistor N2 of the driving signal generating unit 11 is turned on to drive the pull-down signal PD to the second low level VBB (e.g., −200 mV).

Because the fourth PMOS transistor P4 of the current path forming unit 13 is turned on by the pull-up signal PU of the first low level VSS to transfer the level of the pull-up signal PU to the pull-down signal PD, the third NMOS transistor N3 of the driving unit 12 maintains a turned-off state.

The operation of the case where the input signal IN is at the first low level VSS is as follows.

Referring to FIG. 2, when the input signal IN is inputted at the first low level VSS (e.g., 0 V), the second PMOS transistor P2 of the driving signal generating unit 11 is turned on to drive the pull-down signal PD to the first high level VPERI (e.g., 1.4 V).

The third NMOS transistor N3 of the driving unit 12 is turned on by the pull-down signal PD of the first high level VPERI to pull-down drive the output signal OUT to the second low level VBB (e.g., −200 mV). When the output signal OUT is driven to the second low level VBB, the first PMOS transistor P1 of the driving signal generating unit 11 is turned on to drive the pull-up signal PU to the second high level VDD (e.g., 1.8 V).

Because the fourth NMOS transistor N4 of the current path forming unit 13 is turned on by the pull-down signal PD of the first high level VPERI to transfer the level of the pull-down signal PD to the pull-up signal PU, the third PMOS transistor P3 of the driving unit 12 maintains a turned-off state.

As described above, when the input signal IN is at the first high level VPERI, the level shifter according to an exemplary embodiment of the present invention performs a level shifting operation in the direction of a positive voltage to drive the output signal OUT to the second high level VDD. When the input signal IN is at the first low level VSS, the level shifter performs a level shifting operation in the direction of a negative voltage to drive the output signal OUT to the second low level VBB. That is, the level shifter according to an exemplary embodiment of the present invention drives the output signal OUT by level-shifting the input signal (IN) not only in the direction of a positive voltage and but also in the direction of a negative voltage (i.e., in both directions). Thus, the present invention can integrate a level shifter for performing a level shifting operation in the direction of a positive voltage and a level shifter for performing a level shifting operation in the direction of a negative voltage into one circuit, thus making it possible to reduce a layout area that is necessary to implement the level shifter.

The level shifter according to an exemplary embodiment of the present invention may be used not only in semiconductor memory devices but also in various integrated circuits that require a level shifting operation.

The embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. A level shifter comprising:
   a driving signal generating unit configured to generate a pull-up signal and a pull-down signal in response to an input signal, wherein the input signal swings between a first high level and a first low level;
   a driving unit configured to generate an output signal swinging between a second high level and a second low level in response to the pull-up signal and the pull-down signal; and
   a current path forming unit configured to form a current path between the pull-up signal and the pull-down signal in response to the pull-up signal and the pull-down signal,
   wherein the current path forming unit comprises a first diode configured transistor to be turned on to transfer the level of the pull-up signal to the pull-down signal when the pull-up signal is driven to the first low level, and a second diode configured transistor to be turned on to transfer the level of the pull-down signal to the pull-up signal when the pull-down signal is driven to the first high level.

2. The level shifter of claim 1, wherein when the input signal is at the first high level, the driving signal generating unit drives the pull-up signal to the first low level.

3. The level shifter of claim 2, wherein when the input signal is at the first low level, the driving signal generating unit drives the pull-down signal to the first high level.

4. The level shifter of claim 1, wherein the driving signal generating unit drives the pull-up signal and the pull-down signal in response to the output signal.

5. The level shifter of claim 1, wherein when the output signal is at the second high level, the driving signal generating unit drives the pull-down signal to the second low level.

6. The level shifter of claim 1, wherein when the output signal is at the second low level, the driving signal generating unit drives the pull-up signal to the second high level.

7. The level shifter of claim 1, wherein the driving signal generating unit comprises:
   a first driving element configured to drive the pull-up signal to the second high level when the output signal is at the second low level;
   a second driving element configured to drive the pull-up signal to the first low level when the input signal is at the first high level;
   a third driving element configured to drive the pull-down signal to the first high level when the input signal is at the first low level; and
   a fourth driving element configured to drive the pull-down signal to the second low level when the output signal is at the second high level.

8. The level shifter of claim 1, wherein the second high level is higher than the first high level, and the second low level is lower than the first low level.

9. The level shifter of claim 1, wherein when the pull-up signal is driven to the first low level, the driving unit is turned on to drive the output signal to the second high level.

10. The level shifter of claim 1, wherein when the pull-down signal is driven to the first high level, the driving unit is turned on to drive the output signal to the second low level.

11. The level shifter of claim 1, wherein the driving unit comprises:
   a pull-up driving element configured to be turned on to pull-up drive the output signal to the second high level when the pull-up signal is driven to the first low level; and
   a pull-down driving element configured to be turned on to pull-down drive the output signal to the second low level when the pull-down signal is driven to the first high level.

12. The level shifter of claim 1, wherein when the pull-up signal is driven to the first low level, the current path forming unit is turned on to transfer the level of the pull-up signal to the pull-down signal.

13. The level shifter of claim 1, wherein when the pull-down signal is driven to the first high level, the current path forming unit is turned on to transfer the level of the pull-down signal to the pull-up signal.

14. The level shifter of claim 1, wherein when the input signal is at the first high level, the driving signal generating unit drives the pull-up signal to the first low level, the current path forming unit transfers the level of the pull-up signal to the pull-down signal, and the driving unit drives the output signal to the second high level.

15. The level shifter of claim 1, wherein when the input signal is at the first low level, the driving signal generating unit drives the pull-down signal to the first high level, the current path forming unit transfers the level of the pull-down signal to the pull-up signal, and the driving unit drives the output signal to the second low level.

16. A level shifting transistor circuit comprising:
a substrate and a source terminal of a first PMOS transistor are coupled to a second high voltage rail;
a drain terminal of the first PMOS transistor is coupled to a drain terminal of a first NMOS transistor, a gate terminal of a third PMOS transistor, a drain terminal of a fourth NMOS transistor, and a gate terminal and a source terminal of a fourth PMOS transistor;
a substrate and a source terminal of the first NMOS transistor are coupled to a first low voltage rail;
a gate terminal of each of the first NMOS transistor and a second PMOS transistor is coupled to an input node;
a substrate and a source terminal of the second PMOS transistor are coupled to a first high voltage rail;
a drain terminal of the second PMOS transistor is coupled to a drain terminal of a second NMOS transistor, a gate terminal and a source terminal of the fourth NMOS transistor, a drain terminal of the fourth PMOS transistor, and a gate terminal of a third NMOS transistor;
a substrate and a source terminal of the second NMOS transistor are coupled to the second low voltage rail;
a substrate and a source terminal of the third PMOS transistor are coupled to the second high voltage rail;
a drain terminal of the third PMOS transistor is coupled to a gate terminal of the first PMOS transistor, a gate terminal of the second NMOS transistor, a drain terminal of the third NMOS transistor, and an output node;
a substrate and a source terminal of the third NMOS transistor are coupled to the second low voltage rail;
a substrate of the fourth NMOS transistor is coupled to the first low voltage rail; and
a substrate of the fourth PMOS transistor is coupled to the first high voltage rail.

* * * * *